United States Patent [19]

Kalnin et al.

[11] Patent Number: 4,786,837
[45] Date of Patent: Nov. 22, 1988

[54] COMPOSITE CONFORMABLE SHEET ELECTRODES

[75] Inventors: Ilmar L. Kalnin, West Millington; George J. Breckenridge, Jr., Clark, both of N.J.

[73] Assignee: Hoechst Celanese Corporation, Somerville, N.J.

[21] Appl. No.: 46,076

[22] Filed: May 5, 1987

[51] Int. Cl.$^4$ ............................................. H01L 41/08
[52] U.S. Cl. ................................. 310/364; 310/363; 310/365; 310/800; 310/330; 310/332
[58] Field of Search .............................. 310/363–366, 310/330–332, 334, 336, 337, 357, 358, 800

[56] References Cited

U.S. PATENT DOCUMENTS

| | | | |
|---|---|---|---|
| 2,106,143 | 1/1938 | Williams | 310/363 |
| 2,423,922 | 7/1947 | Arndt, Jr. | 171/327 |
| 2,497,665 | 2/1950 | Gravley | 310/364 X |
| 3,586,889 | 6/1971 | Kolter | 310/363 X |
| 3,622,815 | 11/1971 | Schafft | 310/332 |
| 3,629,625 | 12/1971 | Schafft | 310/8 |
| 3,854,060 | 12/1974 | Cook | 310/363 X |
| 3,872,332 | 3/1975 | Butter | 310/363 X |
| 4,068,032 | 1/1978 | Alonso | 310/363 X |
| 4,078,160 | 3/1978 | Bost | 179/110 A |
| 4,333,029 | 6/1982 | Kolm et al. | 310/332 X |
| 4,363,993 | 12/1982 | Nishigaki et al. | 310/332 |
| 4,406,323 | 9/1983 | Edelman | 310/800 X |
| 4,475,014 | 10/1984 | King | 310/332 X |
| 4,530,138 | 7/1985 | Ritter | 29/25.35 |
| 4,609,845 | 9/1986 | Soni et al. | 310/364 X |

OTHER PUBLICATIONS

"Piezoelectric Polymer Flexural Disk Hydrophone", by T. D. Sullivan and J. M. Powers, *The Journal of the Acoustical Society of America*, vol. 63, No. 5, May 1978, pp. 1396–1401.

"Properties of PVDF Polymer for Sonar", by R. H. Tancrell et al, *Proceedings of the IEEE Ultrasonics Symposium*, Catalog No. 85CH2209-5, Oct. 1985, pp. 624–629.

"Composite Piezoelectric Transducers", by R. E. Newnham et al, *Materials in Engineering*, vol. 2, Dec. 1980, pp. 93–106.

"Procedures for Comparing Hydrophone Noise with Minimum Water Noise", by Ralph S. Woollett, *The Journal of the Acoustical Society of America*, vol. 54, No. 5, Apr. 1973, pp. 1376–1379.

*Primary Examiner*—Mark O. Budd
*Attorney, Agent, or Firm*—Depaoli & O'Brien

[57] ABSTRACT

A method is described for making an electroconductive composite sheet electrode which is conformable and in which a slit-and-expanded or perforated nickel screen is embedded by heat and pressure, so that electrical leads can be easily and strongly attached to the nickel screen before or after integrally bonding a electroconductive sheet electrode to each side of at least one adjacent piezoelectric ceramic/polymer composite sheet electrode which is non-conductive. After poling, the resultant transducer has an increased combined transverse stiffness which increases the hydrostatic voltage coefficient, $g_h$, as well as the overall hydrophone Figure of Merit. Because the nickel screen is formed from a continuous metal sheet by slitting and traction or by perforation, it possesses internal electrical continuity and is much more electroconductive than a conventional woven metal wire screen of the same dimensions, thereby enabling the conductive composite electrode to show higher electrical conductivity than a similar woven wire-reinforced one and also lowering the thermally generated electrical noise of the piezoelectric composite transducer formed therefrom.

20 Claims, 1 Drawing Sheet

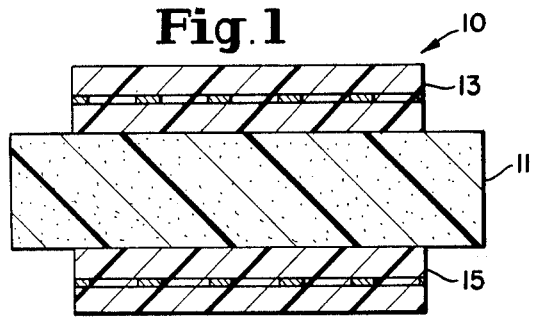
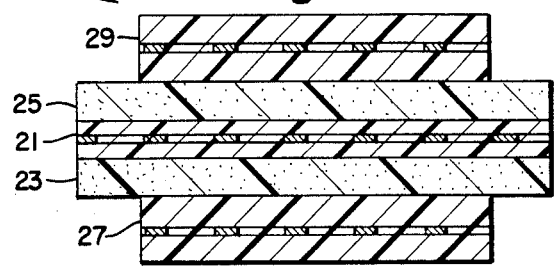
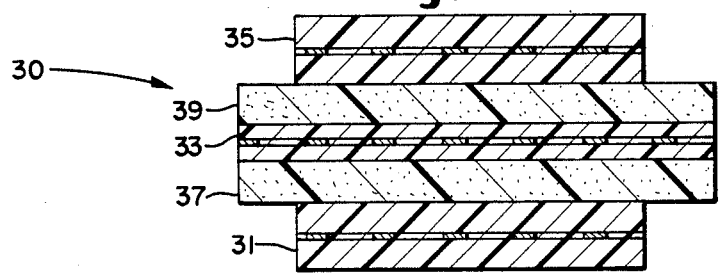
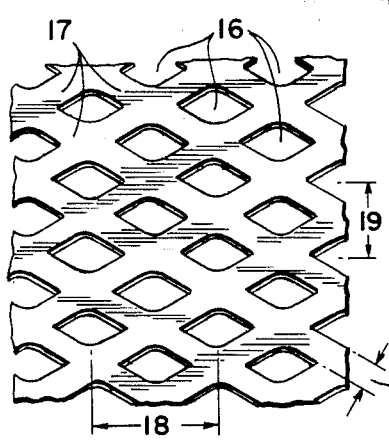
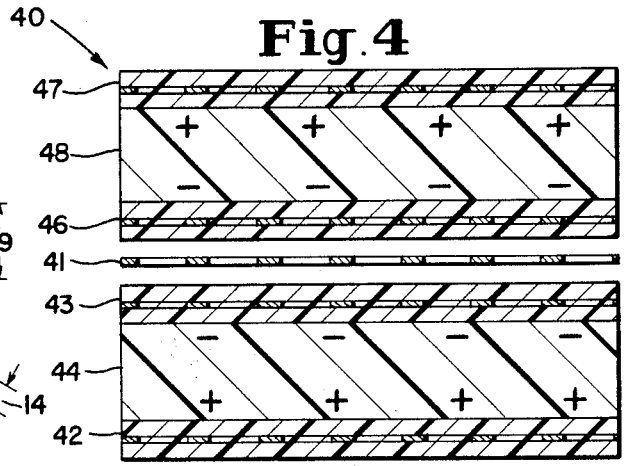
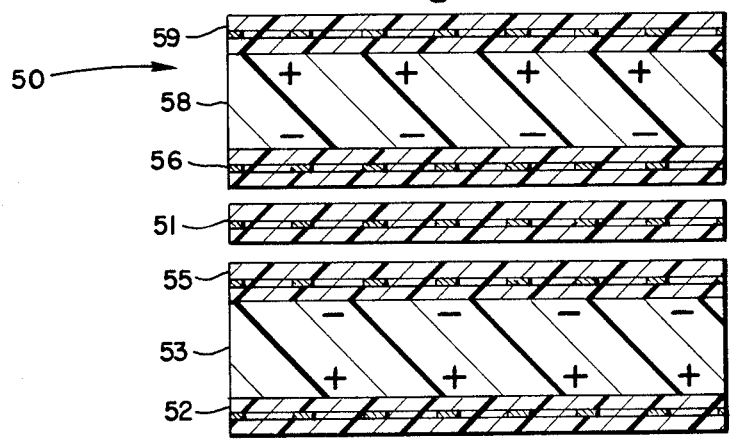

COMPOSITE CONFORMABLE SHEET ELECTRODES

BACKGROUND OF THE INVENTION

1. Field of the Invention

This invention relates to piezoelectric materials and especially relates to providing improved electrodes on flexible and conformable ferroelectric and piezoelectric composites ("piezo-composites") and thick piezoelectric polymer films ("piezo-films") to be used in various electromechanical transducer and sensor applications.

2. Review of the Prior Art

A variety of electro-mechanical transducers, such as hydrophones, noise sensors, vibration sensors, and pressure and stress sensors, depend on the piezoelectric phenomenon exhibited by certain piezoelectric crystals, polarized ceramics, and polarized polymers. Hydrophones, having useful sensitivity and capacitance and able to withstand large hydrostatic pressures, have been made by using piezoelectric polyvinylidene fluoride film as the transduction material. The film is mounted on a stiff circular plate (disk) for strength under hydrostatic pressure; strains developed on the disk surface by incident acoustic pressure are exploited to excite the film, and generate electrical voltage as described by T. D. Sullivan and J. M. Powers, *J. Acoust. Soc. Am.*, Vol. 63, No. 5, May 1978.

Polyvinylidene fluoride (PVDF) in film form has especially been investigated as the sensing material in advanced passive sonar arrays. Its piezoelectric properties are sufficiently high to compete with the established piezoelectric ceramic ("piezo-ceramic") sensor elements, and its conformability and large size make it suitable for large arrays which operate in the hydrostatic receiver mode. PVDF hydrophones have been demonstrated which are free of hydrostatic resonances over a broad frequency range.

As discussed by R. H. Tancrell et al in the *Proceedings of the IEE Ultrasonics Symposium*, Catalog No. 85CH2209-5, pages 624–629 (1985), the Figure of Merit, FM, characterizing the hydrophone element sensitivity, is given by the formula:

$$FM = (d_h)^2(t)(A)/\epsilon' = (d_h)(g_h)(U)$$

where $d_h$ and $g_h$ are the piezoelectric charge and voltage coefficient, respectively, under hydrostatic pressure, t is the thickness, A is the area, U is the volume of the hydrophone element, and $\epsilon'$ is its permittivity. Subjecting a sample to hydrostatic pressure causes the simultaneous application of three orthogonal force components, $F_1$, $F_2$, $F_3$, according to the equation:

$$d_h = d_{31} + d_{32} + d_{33}, \text{ where } d_{31} \alpha\, Q_3/F_1,$$

$$d_{32} \alpha\, \frac{Q_3}{F_2} \text{ and } d_{33} \alpha\, Q_3/F_3,$$

$F_1$ being applied in the stretch direction and in the plane of the polymer, $F_2$ being applied transversely to the stretch direction and also in the plane of the polymer, and $F_3$ being applied perpendicularly to the plane of the polymer. $D_{33}$ is the piezoelectric charge coefficient in the vertical (thickness) direction, and $d_{31}$ and $d_{32}$ are the respective piezoelectric charge coefficients in the transverse plane - $d_{31}$ referring to the stretch direction and $d_{32}$ transversely to it.

A layer of metal deposited on the surface was found to have a dramatic effect on PVDF's elastic and piezoelectric properties, especially the transverse piezo-coefficient, $d_{31}$, due to the softness of the PVDF polymer relative to that of the metal. Although metallic or non-metallic stiffening layers are often included in actual piezo-ceramic hydrophone assemblies to eliminate undesirable resonance frequencies, the properties of the piezo-ceramic do not change upon coating with metal because the latter is not nearly as stiff as the ceramic itself.

During the last decade composite materials have been developed that are piezoelectric as well as flexible. Their composition and properties have been described in reviews, such as the one by R. E. Newnham, L. J. Bowen, K. A. Klicker and L. E. Cross, titled "Composite Piezoelectric Transducers" and published in Materials in Engineering, Vol. 2, December 1980, pp. 93–106. The most common of these are the so-called 0-3 connectivity composites which basically consist of two solid phases—a piezoelectrically active ceramic powder phase and a piezoelectrically inactive but highly coherent polymeric phase, the powder phase being dispersed uniformly in the polymeric phase. The mechanical properties of the 0-3 composites, such as stiffness, are about the same as those of the PVDF, but their piezoelectric and dielectric properties can often be significantly higher.

Both the PVDF and the piezo-composite are suitable for hydrophones, sonobuoys, and sonar arrays that operate in the listening mode, but both exhibit a serious inherent shortcoming in that conductive electrodes can be neither tightly adhered nor strongly and reliably connected electrically thereto.

Currently two approaches to accomplish the electroding and the bonding of electrical leads to the electrodes are being practiced. The first one involves the deposition of a thin layer of a highly electroconductive metal, such as aluminum, copper, nickel, or silver, by evaporation, sputtering, electron beam, or similar techniques onto the appropriate surfaces of the PVDF or the piezo-composite element, followed by soldering, gluing, or otherwise attaching the electrical leads to the metal. The other approach involves procuring a conductive plastic which can be properly bonded to the piezo-composite or the PVDF surfaces to function as the electrode. In this case, the electric leads cannot be soldered because none of the normally known solders will bond to the conductive plastic electrodes, and one resorts to attaching the metal leads to such electrodes by adhesive bonding with electrically conductive adhesives. Both of these approaches have known shortcomings.

In the first case, the as-deposited metal layer electrode is inherently incompatible with the underlying polymer base substrate, so that the latter must be given a demanding prior cleaning and/or surface treatment in order to achieve adequate adhesion. Furthermore, since the thermal expansion coefficients of the metal and the piezoelectric substrate differ greatly, the heat generated during the subsequent soldering of the leads often causes excessive thermal stresses which debond the electrode. Even if an adequate electroding and lead bonding is achieved, the metal electrode, because of its thinness, will have a relatively high electrical series resistance which in use increases its thermal (Johnson) noise and response lag (RC time constant), thereby lowering its electrical performance and frequency response.

In the second case, a satisfactory bonding between the conductive plastic electrode and the piezoelectric polymer base substrate is normally achievable, but the problem of securing the leads to this kind of electrode remains, because it is as difficult to achieve solderability to the conductive electrode as it is to the piezo-composite or the PVDF.

A means allowing the soldering of metallic leads to the above substrates quickly, reliably, and inexpensively, by modification of the conductive electrodes, is badly needed. The prior patent art that deals with the electroding of piezoelectric materials was found to refer to devices or assemblies having only piezo-ceramic as the active material.

In the prior art as disclosed in U.S. Pat. No. 2,423,922, a ribbon or strip of metallic foil, having a coating of material such as wax or a synthetic plastic applied to its opposite faces, has been used for joining together the pre-electroded faces of a pair of crystal sections with colloidal graphite or silver metal by heat and pressure to form a transducer. The ribbon may be made of silver or the like and have integral struck-out projections or teeth in order to establish conductive connection between the foil and substantially the entire electroded surface of each crystal section.

A special piezoelectric transducer called a "bender" or "bimorph", in the form of a flat disk, has been described in U.S. Pat. No. 3,629,625. This flat disk includes a pair of circular ceramic sheets which are precisely separated by a piezoelectrically inactive center vane which is corrugated, the apices of the corrugations being cemented to the sheets. Since the center vane itself provides a conductive path between the electrodes, nonconductive epoxy (which is stronger than conductive epoxy) is used to cement the electrodes and the ceramic sheets to the center vane.

In U.S. Pat. No. 4,078,160, a woven mesh of conductively coated polymeric filaments is described as affixed between a thin piezo-ceramic electroded disc, which is deformable in response to an applied electronic signal, and a second disc, which is identical to the first one and may also be electrically deformable. The mesh serves as a center vane between the two elements and allows the bender elements to move relative to each other. The bender is supported by peripheral tabs which extend from the mesh and are soldered to a terminal, providing electrical contact between and to the outer faces of the piezoelectric disk. The filaments are a stiff polyester and are coated with a metal such as nickel so that the threads are embedded in the metal which is fused at cross-over points. This electrically conducting mesh is further coated with an uncured solid epoxy. The mesh and two transducer elements are assembled together, and heat and pressure are applied to melt and then cure the epoxy, causing the conductive mesh material to make contact with and adhere to the already electroded faces of the transducer elements.

A Tonpilz or longitudinal resonator type of transducer is described in U.S. Pat. No. 4,530,138. This type of transducer includes a head mass for projection and/or receipt of acoustic energy, a tail mass operative as an initial element, and active transducer means interposed between and coupled to the head and tail masses. The active transducer means may be a stack of rings of a ceramic piezoelectric having interposed ring electrodes to which electrical connections are made. The electrode may be stamped out of a thin sheet of annealed nickel which is then corrugated such that the front and rear surfaces are serrated to form a plurality of peaks and valleys. When the electrode is placed between two adjacent components such that the peaks on both surfaces of the electrode make intimate contact with the respective components, the valleys on either surface of the electrode define small passageways. Suitable electrical leads are soldered to tabs projecting from the corrugated electrodes. Flowable adhesive is provided to fill the passageways by evacuating a transducer assembly. Heat is then applied to cure a stack of rings and form a ceramic piezoelectric transducer.

SUMMARY OF THE INVENTION

It is accordingly an object of this invention to provide an electroconductive composite polymer-base electrode material which improves the hydrostatic sensitivity of the adjacent piezoelectric ceramic-polymer composite device with which it is integrally bonded.

It is also an object to provide a means for attachment of electrical leads by soldering to the electrode material.

It is another object to provide controllable increased stiffness in the plane of the sheet or film.

It is still another object to provide controllable enhanced electrical conductivity of the electrode.

It is further an object to provide a process for fabricating such electrodes.

In accordance with these objects and the principles of this invention, a process is herein provided for incorporating a continuous metal screen within a conductive polymer-base composite to which the leads are soldered. The continuous metal screen may be a slit-and-expanded metal screen or a perforated metal screen. It is added onto or into the thermoplastic matrix base electrode by hot pressing to produce a modified electrode which is laminated to the piezoelectric sheet to produce electrode/piezo-composite/electrode laminates or assemblies thereof, having various desirable configurations.

The resulting advantages are: (1) metal lead wires can be readily soldered to an exposed portion of the screen to yield a strong electrical contact; (2) if the screen has a higher elastic modulus than the piezoelectric composite, the combined transverse stiffness of the whole electroded sensor is increased, thereby increasing the hydrostatic voltage coefficient, $g_h$, as well as the overall hydrophone Figure of Merit; and (3) because the continuous metal screen is originally formed from a continuous metal sheet by slitting and traction or by perforation, it possesses internal electric continuity and is much more electroconductive than a conventional woven metal wire screen of the same dimensions. Slit-and-expanded metal screens are highly preferred, but perforated metal screens are satisfactory.

Slitting is done by cutting or punching a plurality of parallel slits in a metal sheet, the slits typically being 0.5 to 15 mm in length and 0.1 mm to 1.5 mm apart, without extending any slit closer than 3 mm to any edge. Expanding is done simultaneously with the slitting by means of specially shaped teeth which determine the form and number of openings. The teeth exert traction in the plane of the sheet and transversely to the slits to increase the dimension of the screen, measured transversely to the slits, by 3 to 30 times.

Slit-and-expanded screens are available in most ductile metals from the Exmet Corporation of Bridgeport, Conn. The screens have approximately 25 to 2,600 diamond-shaped openings per square inch, each opening being bounded by four strands having a width which is from one to six times the metal sheet thickness. The overall thickness of the screen is less than twice the strand width.

Alternatively, a similar metal sheet may be perforated with a number of holes to achieve a hole/solid area ratio of at least 30% and preferably at least 40%. The holes in a perforated screen may also differ in size and in shape.

A screen from the Exmet Corporation having a mesh size of 4/0 was found to be the most satisfactory. This size has 625 openings per square inch. The diamond-shaped openings are 0.077 inch in length and have available widths of 0.038–0.046 inch, measured from center-to-center of the joints. The available thickness of the original metal sheet is 0.002–0.12 inch. The available strand width is 0.004–0.020 inch.

The screen may also be fabricated in a manner so as to be mechanically anisotropic in the transverse plane, i.e., the Young's modulus in the 2 direction may differ from that in the 3 direction. Such anisotropy enables one to fabricate electroded composites with transversely anisotropic piezoelectric properties. This property is advantageous in cases in which it is desired to generate several resonances in the composite or to broaden the resonance bandwidth.

Consequently, this continuous metal screen-reinforced composite electrode shows higher electrical conductance than a conventional conductive polymer electrode or a woven wire-reinforced one. A higher electrode conductance is beneficial, because it increases the total conductance of the equivalent electrical circuit representing a hydrophone sensor and hence decreases the thermally generated electrical noise (Johnson noise) level. In addition, the conductance can be adjusted to a desired magnitude by changing (a) the distance between the slits, (b) the number of slits per unit area, (c) the thickness of the metal sheet to be expanded, and (d) the extent of traction applied in the longitudinal and transverse directions of the sheet during the expansion.

For perforated screens, the conductance can be adjusted by changing the hole/solid area ratio from at least 30% to at least 40%.

The method comprises laminating a continuous metal screen into a conductive sheet electrode which is then bonded to the faces of a piezo-composite sheet. The continuous metal screen is a slit-and-expanded metal screen or a perforated metal screen. Sheet is hereinafter used as the term representing a sheet have a selected thickness greater than 0.2 mm or a film having a thickness less than 0.2 mm. The conductive sheet electrode is preferably a thin, flexible, conformable carbon polymer composite base element. When the metal screen and the conductive sheet have been bonded together into a single electrode, it is hereinafter defined as a screen-reinforced composite electrode. The piezo-composite sheet electrode is likewise a thin, flexible sheet or film of selected thickness, but it is a non-conductive 0-3 piezoelectric ceramic/elastomer or polymer. When a screen-reinforced composite has been bonded to each face of a piezo-composite sheet, the resultant integrally bonded assembly, before and after poling, is hereinafter defined as an electroded composite. After attachment of electrical leads to exposed portions of the metal screen, it is hereinafter defined as a transducer.

Because a metal electrical wire can readily be attached to an exposed portion of the screen, metal wire-to-composite adhesion problems are eliminated without creating such high temperatures as to cause debonding. Initial results indicate an approximately 50% increase in $g_h$ when electrical leads are affixed in this manner. This method also provides practical advantages in that the screen acts as a lateral stiffener and, at the same time, the screen nevertheless provides for some formability.

The method of this invention for preparing a piezoelectric transducer, having a substantially increased hydrostatic piezoelectric voltage coefficient, $g_h$, comprises the following steps:

A. forming a piezoelectric composite sheet by the following steps:
 (1) heating, melting, and shear mixing a thermoplastic polymer or elastomer at or above its melt temperature,
 (2) adding a selected piezo-ceramic powder, having a mean particle size in the 1–20 μm range, and mixing thoroughly at that temperature while adjusting the mixing rate so as to obtain a melt viscosity in the range of $10^3$ to $10^5$ Poise to form a first mix, and
 (3) forming the first mix into a sheet of selected thickness;

B. forming a conductive polymer base sheet electrode by the following steps:
 (1) heating, melting, and shear mixing a thermoplastic polymer or elastomer at or above its melt temperature,
 (2) admixing therewith a selected powder consisting of an electrically conductive metal, such as copper or nickel, or a conductive nonmetal, such as amorphous or graphitic carbon having a mean particle size between 0.5 and 50 μm, and preferably between 1 to 20 μm, that is piezoelectrically inactive, to form a second mix, and
 (3) forming the second mix into a thin, flexible conductive composite sheet or film as a conductive polymer base for the sensor or transducer;

C. cutting a continuous metal screen to the same size as the conductive polymer base sheet to be joined;

D. forming a screen-reinforced composite electrode by the following steps:
 (1) cleaning and degreasing the metal screen, and
 (2) placing the cleaned and degreased screen upon the conductive polymer base and impressing the screen into the base by application of heat and pressure;

E. applying heat and pressure to conjoin the screen-reinforced composite electrode, made as described in Step D, to each side of one or several piezo-composite sheet pieces, made as described in Step A, to make an electroded composite;

F. exposing the electroded composite to a high electrostatic field of at least 5 KV/mm (kilovolts/millimeter), applied in the thickness direction, at elevated temperatures for a selected period of time and then cooling it with the field on, thereby aligning the dipolar domains of the piezo-ceramic powder with the field direction, whereby the aligned domains remain permanently aligned and the electroded composite becomes ferroelectric; and G. attaching electrical leads to exposed portions of the metal screen to make the piezoelectric transducer.

A suitable ceramic, in powder form, is a solid solution of 50 mol % each of lead titanate and bismuth ferrite, designated PTBF, and fabricated by the Celanese Corporation. Other suitable electrical ceramic powders are lead titanate, lead manganese niobate, and lead zinc niobate or alloys thereof, most of which have to be prepared by special order to electrical ceramic powder manufacturers.

The percentage amount of the piezo-ceramic powder in the finished mix of Step A may range from 35 to 75 volume % and is preferably in the 60 to 70 volume % range. The amount of the electroconductive powder in the finished mix of Step B may be in the range of 20 to 60 volume %, and preferably in the range of 35 to 45 volume %. The most suitable screen is designated 5Ni5.5 4/0 by the Exmet Corp., thereby indicating a sheet thickness of 5 mils, a sheet content of nickel, a strand width of 5.5 mils, and a mesh size of 4.0, corresponding to approximately 625 openings per square inch.

In more detail with respect to laboratory procedures, the method may be described as forming a piezoelectric composite sheet (>0.2 mm in thickness) or film (<0.2 mm in thickness) by preparing a suitable pelletized thermoplastic polymer or elastomer and placing the amount necessary to produce the desired final concentration in the composite in a heated shear mixing container and subjecting it to simultaneous melting and mixing action. The required amount of a suitable piezo-ceramic powder, such as PTBF, having a mean particle size in the 1-20 $\mu$m range, is then added to the polymer melt and both are thoroughly mixed together. The solidified mix is removed from the container and pieces of it are put into a heated roll mixer machine and rolled out into a thin sheet which is heated and pressed to a uniform desired thickness. This sheet is finally cut into pieces of a selected size for making a desired piezoelectric sheet.

A conductive polymer base sheet is made by an analogous procedure, except that an electrically conductive but piezoelectrically inactive powder, such as carbon, nickel, or copper, is added to the polymer melt instead of a piezo-ceramic powder, the final product being a thin, flexible conductive plastic base composite sheet or film which is also cut into pieces of the same size and shape as the pieces of the piezoelectric composite sheet.

A composite electrode, containing a continuous metal screen and at least one piece of the conductive plastic base, is then made. The metal screen is preferably made of nickel. It can be produced by perforating a nickel sheet or by slitting and expanding a sheet of nickel. More conveniently, such a screen can be commercially purchased. The screen is next carefully cleaned, degreased, cut into pieces of the same size as the pieces of the piezoelectric sheet and the conductive sheet, placed onto a piece of the conductive polymer base sheet, and impressed into the base sheet by means of heat and pressure. (Alternately, the screen can be placed between two pieces of the conductive sheet which are then bonded together as above to form a single composite electrode sheet of approximately double the initial thickness.)

A layup is then made of at least two composite electrodes and at least one of the piezoelectric pieces. Heat and pressure are applied to conjoin a composite electrode to each side of one or several of the piezoelectric composite pieces to make an electroded composite.

This electroded composite is exposed to a high electrostatic field of at least 5 KV/mm (kilovolts/millimeter), applied in the thickness direction, at elevated temperatures for a period of time and is next cooled with the field on, thereby aligning the dipolar domains of the piezo-ceramic powder with the field direction, which remain permanently aligned after the cooling, and rendering the whole composite ferroelectric.

A portion of the metal screen embedded in the electrode is then exposed, and electrical leads are attached to the exposed portion, preferably by conventional soldering. The completed transducer element may be further encapsulated in a protective sheath, mounted onto a plate, or be otherwise incorporated in a suitable package.

BRIEF DESCRIPTION OF THE DRAWINGS

The invention may be more readily understood by referring to the following drawings which are not made to scale. The electrodes are actually much thinner than shown in the drawings. Leads are illustratively shown only in FIG. 1.

FIG. 1 is a sectional elevation of a basic composite transducer comprising a piezo-ceramic/polymer sheet which is straddled by a pair of composite sheet electrodes of this invention, each having an expanded nickel screen embedded into its carbon/polymer matrix.

FIG. 2 is a sectional elevation of a similar transducer comprising a central composite sheet electrode of this invention which is straddled by a pair of ceramic/polymer sheets which are in turn straddled by a pair of carbon/polymer electrodes without an expanded nickel screen therein.

FIG. 3 is a sectional elevation of another similar transducer, comprising three graphite/polymer sheet electrodes having expanded nickel screens therein which are separated by a pair of piezo-ceramic/polymer sheets.

FIG. 4 is a schematic representation in elevation of the components of a transducer prior to their being joined together, consisting of a pair of sensors, each formed from a piezoelectric ceramic/elastomer nonconductive sheet which is straddled by a pair of conductive sheet electrodes that straddle an expanded metal screen. The + and − signs in this and the subsequent Figure indicate that the sensors are unidirectionally polarized ("poled") prior to being joined together.

FIG. 5 is a schematic representation of another transducer in elevation before being joined together, in which a pair of sensors, made as described for FIG. 4, are shown in the polarized state and surrounding an expanded metal screen impregnated previously with the conductive polymer composite.

FIG. 6 is perspective view of a portion of a slit-and-expanded metal screen.

DESCRIPTION OF THE PREFERRED EMBODIMENTS

A number of test transducers were fabricated according to the method described hereinbefore and as shown in the drawings. Each transducer comprised at least one piezoelectric composite sheet and at least one conductive carbon/polymer sheet electrode in which a nickel screen, formed from an integral slit-and-expanded nickel sheet, was selectively embedded. Such a slit-and-expanded metal screen is shown as an enlarged perspective view in FIG. 6. A 4/0 screen has an array of 625 diamond-shaped openings 16 per square inch in which the length 18 is 0.077 inch and the width 19 is 0.038 inch to 0.006 inch. Strands 17, having widths 14, separate adjacent diamond-shaped openings 16.

EXAMPLE 1

A. Each piezo-composite sheet was made from a previously compounded mixture of a powdered piezoelectric ceramic and an ethylene-propylene-diene elastomer, commonly known as EP rubber (EPR) in crumb form. The powdered ceramic was a solid solution of lead titanate and bismuth ferrite and may hereinafter be designated as PTBF. This mixture was passed through a heated roll mill, commonly called a "rubber mill", to form a sheet of 0.75–0.8 mm thickness. A portion of the sheet was then placed in a 0.7 mm thick mold frame in a platen press, held for 5 minutes at 105° C., then pressed for 1.5 minutes at 4,500 lbs and 105° C., and thereafter for an additional 0.8 minute at 4500 lbs and 90° C. The resultant piece, which was 0.70 mm thick and uniform in thickness and appearance, was cut into square pieces measuring approximately 32 mm on the side.

The conductive electrode was made by selecting a previously compounded and rolled sheet, made as previously described by dispersing powdered graphitic carbon, commonly called graphite, in the EPR polymer, placing it in a platen press, then placing the expanded nickel screen on top, and covering on both sides with a sheet of Teflon® release agent. The nickel screen had been cleaned and degreased by ultrasonic washing in methylene chloride. The graphite/EPR composite sheet and the nickel screen were held for 5 minutes at 105° C. in a platen press and then pressed for 0.8 minute at 1,000 lbs. The conductive polymer base sheet pushed neatly through the screen to form a strongly coherent conductive composite electrode material which was cut into approximately 28.5 mm size squares.

Bonding of the conductive electrodes to a piezo-composite piece was done by centering a square 15 of the conductive electrode onto a square piezo-composite piece 11, holding the assembly for 5 minutes at 105° C. in a platen press, and then pressing for 0.5 minute at 850 lbs. The resulting laminate was then turned over, a second square 13 of the conductive electrode was placed on top of it, and the pressing procedure was repeated. Finally, the laminate was cured for 45 minutes at 170° C. and 200 lbs pressure to produce laminate 10 shown schematically in FIG. 1.

This laminate was next poled in an electrostatic field at up to 9.75 KV/mm and 90° C. for 60 minutes Leads 14, 16 were attached to exposed portions of the screens in electrodes 13, 15, respectively to produce a ferroelectric piezo-composite transducer which had the following measured properties: the piezoelectric charge coefficient in the thickness direction, $d_{33}$, of ~30 pC/N (picocoulombs/newton), and the hydrostatic piezoelectric voltage coefficient, $g_h$, of 0.110 Vm/N (volt-meters/newton). The $d_{33}$ was measured on a commercially available apparatus, called a Berlincourt $d_{33}$ Piezo Meter, and the $g_h$ was measured on a proprietary apparatus, similar to the one described by Tancrell et al in the previously cited reference, but having a single driving speaker instead of two.

B. A similar transducer was prepared in the manner described above, except that the conductive electrode did not contain the expanded nickel screen, and the maximum poling voltage that could be applied without dielectric breakdown was 11 KV/mm at 90° C. for 5 minutes. The measured $d_{33}$ and $g_h$ values were 36 pC/N and 0.070 Vm/N, respectively. Comparison of the properties showed that even though the $d_{33}$ of the transducer with the nickel screen-containing electrodes was slightly lower due to the lower applied poling field, the $g_h$ was substantially enhanced—by about 50% in this case. According to our extensive previous experience, the $g_h$ values of the conventionally made piezo-composite transducers, i.e. without using the metal screen-containing electrodes, are typically in the 0.050 to 0.075 Vm/N range.

EXAMPLE 2

Two identical piezoelectric sheet pieces 23, 25 of the same thickness as that of Example 1 were taken from a piece of the PTBF/EPR sheet that was prepared in a 0.7 mm mold frame by soaking it for 5 minutes at 105° C. in a platen press and then pressing for 1.5 minutes at 4500 lbs at 105° C. and for 0.8 minute at 4500 lbs and 90° C. The final depth was 0.72 mm.

A conductive composite electrode containing the nickel screen was prepared as described for Example 1. A piece 21 of this electrode was placed between these two piezo-composite pieces 23, 25 to form a sandwich which was laminated by heat and pressure as described in Example 1. Two conductive polymer electrodes 27, 29, not containing a nickel screen, were thereafter sequentially laminated to the outer faces of this laminate to create an assembly 20, as shown in FIG. 2. This assembly was poled at up to 12 KV/mm and 95° C. for 20 minutes. The resulting transducer showed a $d_{33}$ value of 29 pC/N and $g_h$ of 0.093 Vm/N. This enhanced $g_h$ value clearly indicates the beneficial stiffening effect of the incorporation of the metal screen in the conductive layer of the piezo-composite transducer.

EXAMPLE 3

Another multiple laminate containing piezo-composite and conductive polymer pieces, of the same kind and configuration as described in Example 2, was fabricated, except that the piezo-composite pieces were pressed to 0.38 mm thickness, using a different mold frame. This laminate was poled at up to 9.8 KV/mm for 60 minutes at 90° C. to create a transducer. The piezoelectric coefficients of this transducer were: $d_{33}=30$ pC/N and $g_h=0.090$ Vm/N. These values are very close to those of Example 2, indicating that the $g_h$ enhancement does not depend on the thickness of the piezo-composite layer.

EXAMPLE 4

Another multiple laminate 30, containing piezo-composite pieces 37, 39 and conductive pieces 31, 33, 35 of the same configuration and prepared the same way as that of Example 3, was fabricated, except that in this case both center electrode 33 and outer electrodes 31, 35 contained the embedded expanded nickel screen, as shown schematically in FIG. 3. This laminate 30 was poled at up to 11.2 KV/mm for 60 minutes at 91° C. The measured piezoelectric coefficients of this transducer were: $d_{33}=30$ pC/N and $g_h=0.102$ Vm/N. Comparison of these with the respective magnitudes given in Example 3 shows that increasing the number of the nickel screen-containing conductive electrodes enhances the hydrostatic voltage sensitivity, as indicated by the increase in $g_h$.

EXAMPLE 5

An expanded nickel screen 41, having a thickness of about 0.24 mm and a diamond configuration, was cleaned in methylene chloride and dried. A schematic layup 40 of the components forming a transducer, as shown in FIG. 4, consisted of plain nickel screen 41 and two electroded and poled piezo-composite sensors below and above it. The lower sensor was formed from conductive polymer electrodes 42, 43 and piezo-composite 44. The upper sensor was formed in the same manner, using conductive polymer electrodes 46, 47 and piezo-composite 48. Both were then poled in a d.c. field of 21 KV/mm for 15 minutes at 80° C. to give a $d_{33}$ of about 48 pC/N. After poling, the sensors and the screen were laid up together as shown in FIG. 4 and laminated by heat pressing in a platen press for 8 minutes at 104° C. at contact pressure and then for 0.6 minutes at 800 psi. The $d_{33}$ after the lamination was 39 pC/N.

EXAMPLE 6

A pair of sensors was made and poled to $d_{33}$ of about 48 pC/N as described in Example 5, and a conductive electrode 51 was prepared with an expanded nickel screen impregnated with carbon/elastomer composite. As seen in FIG. 5, a conductive electrode 52, a piezo-composite 53, and another conductive electrode 55 formed the lower sensor, and a conductive polymer electrode 56, a piezo-composite 58, and conductive electrode 59 formed the upper sensor. A conductive polymer 51 with a nickel screen imbedded therein was formed by consolidating them at 6000 psi and 107° C. for one minute. The final pressing of the three parts was done at 108° C. and contact pressure for 9 minutes and then 700 psi for 0.6 minute to form composite laminate 50. The $d_{33}$ after the lamination was 37 pC/N.

The results of Examples 5 and 6 show that the nickel screen-containing polymeric electrode can be laminated to already poled piezo-composite sensors without excessive loss in the piezoelectric properties, as demonstrated by the 77–81% retention of the original $d_{33}$ value.

The tensile modulus of the slit-and-expanded nickel screen used in the preceding examples was $3.6 \times 10^6$ psi in the longitudinal direction and $1.0 \times 10^6$ psi transversely to it. Since these values are much larger than the tensile modulus of about $0.3 \times 10^6$ psi of the piezo-composite, the introduction of the non-woven metal screen provides: (1) transverse stiffening leading to a larger $d_{33}/d_{31}$ ratio, (2) enhanced electrical conductivity, and (3) strong electrical contact for soldered leads.

The following tabulation furnishes a property comparison of 0–3 piezo-composite transducers containing nickel screen reinforced electrodes and similar ones without such reinforcement.

Because it will be readily apparent to those skilled in the art of making piezoelectric transducers that innumerable variations, modifications, amplifications, and extensions of the examples and principles hereinbefore set forth can be made without departing from the spirit and the scope of the invention, what is hereby defined as such scope and is desired to be protected should be measured, and the invention should be limited, only by the following claims.

TABLE

| | Relative Permittivity | Dielectric Loss | $d_{33}$ | $g_h$ | $d_h g_h$ | Poling Condition Field (KV/mm)/ Temp (°C.) |
|---|---|---|---|---|---|---|
| Piezo-composite transducers without screens (average of 2) | 13.5 | .016 | 42 | 75 | 800* | 12/92° |
| Piezo-composite transducers with screen-containing electrodes (average of 4) | 14.5 | .019 | 30 | 105 | 1700* | 10–12/90° |

*These values represent the hydrophone Figure of Merit and show the overall benefit of transverse reinforcing.

What is claimed is:

1. A composite sheet electrode, comprising a conductive polymer sheet or film and a slit-and-expanded screen formed from a sheet of a selected metal, said conductive polymer in said polymer sheet being ethylene/propylene/diene elastomer (EPR) and said metal sheet being embedded into said polymer sheet and having exposed portions to which electrical leads can be soldered.

2. The composite electrode of claim 1, wherein said metal is nickel.

3. The electrode of claim 1, wherein said sheet or film comprises an electrically conductive but piezoelectrically inactive powder which is selected from the group consisting of carbon, nickel, and copper.

4. The electrode of claim 1, wherein said selected metal is nickel.

5. The electrode of claim 1, wherein said screen has approximately 25 to 2,600 diamond-shaped openings per square inch, each said opening being bounded by four strands having a width which is from one ot six times the thickness of said metal sheet.

6. The electrode of claim 5, wherein said screen has approximately 625 diamond-shaped openings per square inch and said sheet thickness is 0.002–0.12 inch before expansion of said sheet.

7. The elctrode of claim 1, wherein said screen is mechanically anisotropic in the transverse plane thereof, whereby several resonances can be generated in said composite sheet electrode or the resonance bandwidth thereof can be broadened.

8. The electrode of claim 5, wherein said openings are formed by expansion of said metal sheet from slits therein, said slits being 0.5 to 15 mm in length and 0.1 to 1.5 mm apart, without extending any slit closer than 3 mm to any edge of said metal sheet.

9. The electrode of claim 8, wherein said composite sheet electrode has a conductance that is:
   A. higher than the conductance of a conventional conductive polymer electrode or a woven-wire reinforced electrode; and
   B. adjustable to a desired magnitude by changing:
      (1) the distance between said slits,
      (2) the number of said slits per unit area in said metal sheet,
      (3) said metal sheet thickness, and
      (4) the extent of traction applied in the longitudinal and transverse directions of said metal sheet during said expansion thereof.

10. A piezoelectric transducer, having a substantially increased hydrostatic piezoelectric voltage coefficient and lowered thermally generated electrical noise, comprising:

A. A piezoelectric composite sheeet comprising a thermoplastic polymer and a piezo-ceramic powder having a particle size in the 1–20 μm range;
B. a conductive composite sheet electrode, containing a thermoplastic polymer and a continuous slit-and-expanded metal screen, said screen being embedded in said polymer and one of said composite sheet electrodes being bonded to each side of said piezoelectric composite sheet; and
C. electrical leads attached to exposed portions of said metal screen.

11. A piezoelectric transducer, having a substantially increased hydrostatic piezoelectric voltage coefficient and lowered thermally generated electrical noise, comprising:
A. a piezoelectric composite sheet comprising a thermoplastic polymer and a piezo-ceramic powder having a particle size in the 1–20 μm range;
B. a conductive composite sheet electrode, containing a thermoplastic polymer and a continuous metal screen, which is bonded to each side of said piezoelectric composite sheet; and
C. electrical leads attached to exposed portions of said metal screen, wherein said polymer, in both said piezoelectric composite sheet and in said composite sheet electrode, is an ethylene/propylene/diene elastomer (EPR).

12. The transducer of claim 10, wherein said conductive composite sheet electrode comprises an electrically conductive but piezoelectrically inactive powder which is selected from the group consisting of carbon, nickel, and copper.

13. The transducer of claim 12, wherein said carbon is graphite.

14. The transducer of claim 10, wherein said piezo-ceramic powder is a solid solution of lead titanate and bismuth ferrite (PTBF).

15. The transducer of claim 10, wherein said continuous metal screen is a slit-and-expanded nickel screen.

16. The transducer of claim 15, wherein said screen has approximately 25 to 2,600 diamond-shaped openings per square inch, each said opening being bounded by four strands having a width which is from one to six times the thickness of said metal sheet, and the overall thickness of said screen being less than twice said strand width.

17. The transducer of claim 16, wherein said screen has approximately 625 diamond-shaped openings per square inch and said sheet thickness is b 0.002–0.12 inch before expansion thereof.

18. The transducer of claim 16, wherein said screen is mechanically anisotropic in the transverse plane thereof, whereby several resonances can be generated in said composite sheet electrode or the resonance bandwidth thereof can be broadened.

19. The transducer of claim 16, wherein said openings are formed by expansion of said metal sheet from slits therein, said slits being 0.5 to 15 mm in length and 0.1 to 1.5 mm apart, without extending any slit closer than 3 mm to any edge of said metal sheet.

20. The transducer of claim 19, wherein said composite sheet electrode has a conductance that is:
A. higher than the conductance of a conventional conductive polymer electrode or a woven-wire reinforced electrode; and
B. adjustable to a deisred magnitude by changing:
(1) the distance between said slits,
(2) the number of said slits per unit area in said metal sheet,
(3) said metal sheet thickness, and
(4) the extent of traction applied in the longitudinal and transverse directions of said metal sheet during said expansion thereof.

* * * * *